United States Patent [19]

Rollman

[11] 4,243,933
[45] Jan. 6, 1981

[54] CAPACITANCE MEASUREMENT APPARATUS

[75] Inventor: Charles D. Rollman, Concord, Mass.

[73] Assignee: Analogic Corporation, Wakefield, Mass.

[21] Appl. No.: 944,160

[22] Filed: Sep. 20, 1978

[51] Int. Cl.³ ............................................. G01R 27/26
[52] U.S. Cl. .............................. 324/60 CD; 324/60 C
[58] Field of Search ............. 324/60 CD, 60 C, 60 R, 324/61 R

[56] References Cited

U.S. PATENT DOCUMENTS

| 3,452,272 | 6/1969 | Collins et al. | 324/60 CD |
| 3,761,805 | 9/1973 | Dornberger | 324/60 C |

Primary Examiner—Ernest F. Karlsen
Attorney, Agent, or Firm—Weingarten, Maxham & Schurgin

[57] ABSTRACT

Capacitance measurement apparatus in which an output signal representative of the capacitance of a capacitor under test is provided without requirement for absolute measurement of the voltage level or absolute measurement of time interval. A first signal is provided representing the voltage difference between the charge levels of the capacitor. A second signal is provided representing the average current from the capacitor during the time interval that the capacitor undergoes a change in its charge states. The ratio of the second signal to the first signal is representative of capacitance.

23 Claims, 11 Drawing Figures

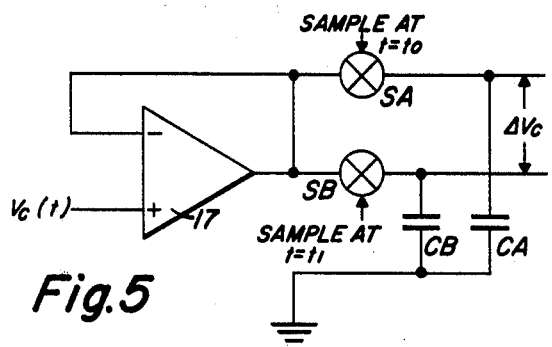
Fig.5
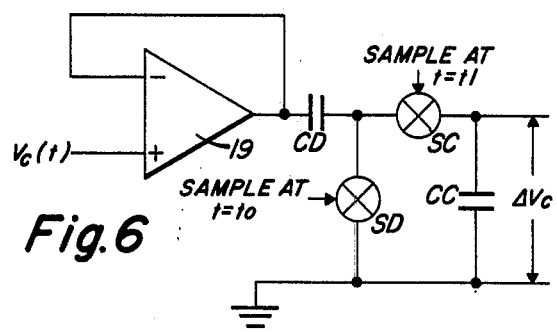
Fig.6
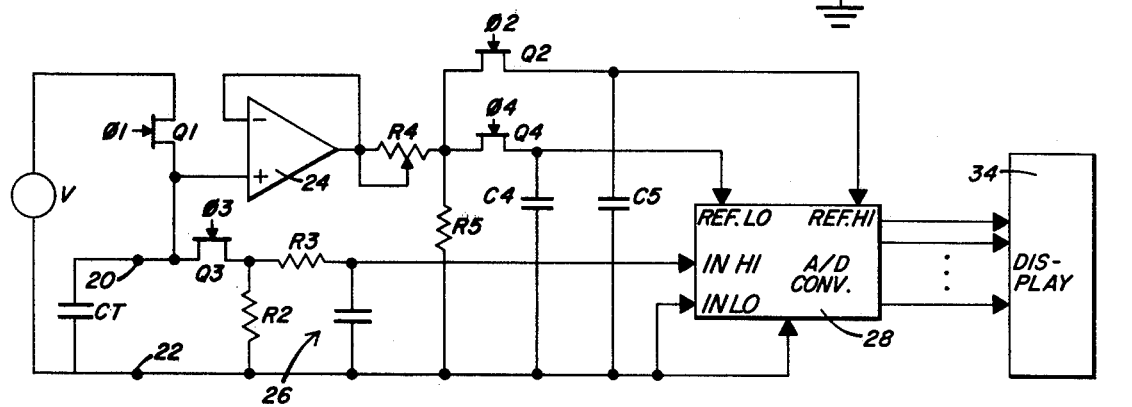
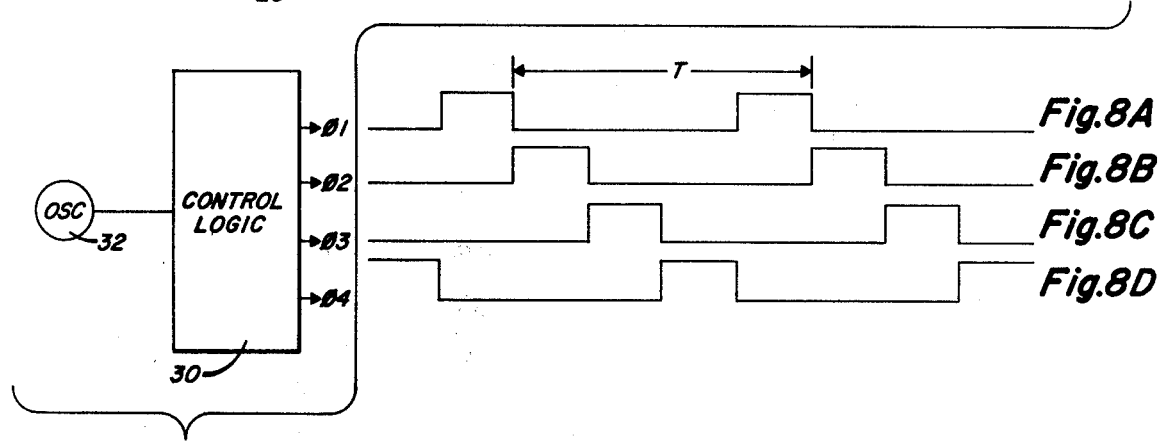
Fig.7
Fig.8A
Fig.8B
Fig.8C
Fig.8D 4,243,933

CAPACITANCE MEASUREMENT APPARATUS

FIELD OF THE INVENTION

This invention relates to capacitance measurement and more particularly to apparatus for measurement of capacitance in a manner independent of the absolute charge levels of the capacitor and its time constant.

BACKGROUND OF THE INVENTION

Many techniques for measurement of capacitance are known and have been variously implemented. In many, the voltage levels to which a capacitor which is to be measured is charged and discharged must be precisely determined or there must be accurate determination of the time interval during which measurement is being made. According to one known capacitance measurement technique, a capacitor is charged with a constant current and a time measurement is made from an initial voltage level to a final voltage level, the capacitance being a function of the time interval during which the applied current causes a given voltage change. According to another known technique, a capacitor is charged to some voltage and then discharged into a resistor of known value and the time measured from first voltage level to a second voltage level, the time being proportional to capacitance. Yet another known technique employs a sinusoidal voltage to excite a capacitor and measure the in-phase and quadrature current components from the capacitor, the capacitance being proportional to the ratio of quadrature current to voltage.

According to a further known capacitance measuring technique, described in U.S. Pat. No. 3,480,848, a capacitor is repetitively charged to its fully charged state and discharged to its fully discharged state, the average current measured due to the repetitive discharge of the capacitor being proportional to capacitance. The proportionality of current to capacitance is valid only when the discharge time is sufficient to completely discharge the capacitor.

SUMMARY OF THE INVENTION

Briefly, the present invention provides a capacitance measurement technique which is independent of the absolute charge levels and time constant of the capacitor under test. The invention does not require absolute measurement of voltage levels nor absolute measurement of time interval. According to the invention, a capacitor is charged to a first voltage level and discharged to a second voltage level, the levels being of any convenient value and which need not necessarily provide fully charged or discharged states of the capacitor. Means are provided for measuring the voltage difference between the two charge levels of the capacitor and producing a first signal representing such difference. Means are also provided for measuring the average current from the capacitor, and thereby the charge removed from the capacitor during the discharge interval and producing a second signal representing the average current. The ratio of the second signal to the first signal is representative of capacitance.

The invention is operative to measure capacitance by employing only a single charge-discharge cycle or by employing a repetitive number of cycles. The ratiometric measurement can be provided by many different circuits, a particularly effective means being a dual-slope analog-to-digital converter wherein the signal representative of voltage difference is applied to the reference input thereof and the signal representative of average current applied to the signal input thereof thereby to produce a digital output signal proportional to capacitance.

DESCRIPTION OF THE DRAWINGS

The invention will be more fully understood from the following detailed description taken in conjunction with the accompanying drawings, in which:

FIGS. 5 and 6 are schematic diagrams of typical operational amplifier circuits useful in the invention to provide a measure of voltage change between first and second voltage levels;

FIG. 7 is a schematic diagram of capacitance measurement apparatus embodying the invention and employing an analog-to-digital converter; and FIGS. 8A–8D are timing diagrams of the control signals employed in the circuit of FIG. 7.

DETAILED DESCRIPTION OF THE INVENTION

Figure 1:
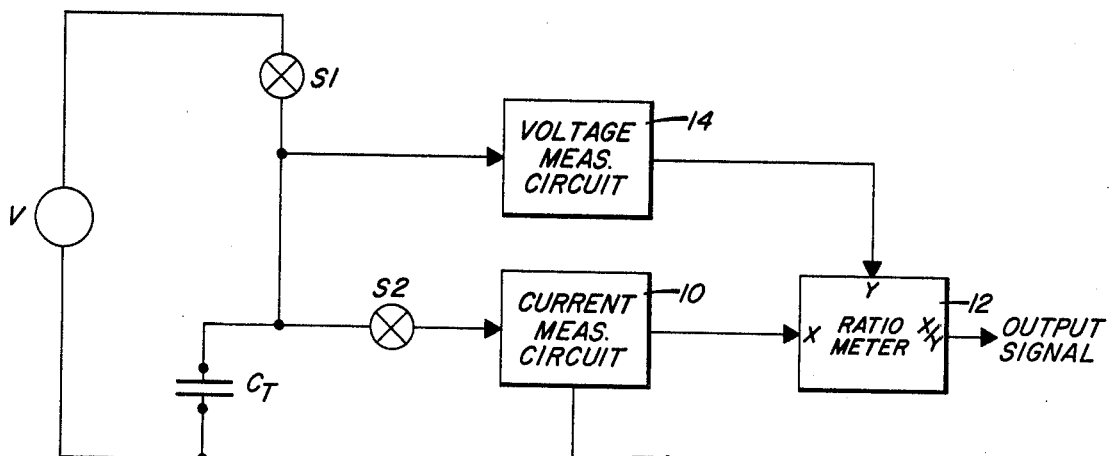
FIG. 1 is a diagrammatic representation of capacitance measurement apparatus according to the invention.

Referring to FIG. 1, there is shown a generalized schematic of a capacitance measurement technique according to the invention. A capacitor $C_T$, for which the capacitance is to be measured, has one terminal connected via a switch S1 to a voltage source V, via a second switch S2 to a current measurement circuit 10, and also to a voltage measurement circuit 14. The other terminal of the capacitor is also connected to the circuit 10 and the voltage V. The output signals from circuit 10 and circuit 14 are applied to the two inputs, X and Y, respectively, of ratiometer circuit 12, operative to provide an output signal representative of the ratio of the magnitude of the signal applied to the X input to the magnitude of the signal applied to the Y input, and which is proportional to the capacitance of capacitor $C_T$.

In operation, switch S1 is first closed to connect the capacitor $C_T$ to the voltage source V for charging of the capacitor to a voltage. Switch S1 is then opened and switch S2 is closed to discharge the capacitor through circuit 10. The discharge current of the capacitor during the discharge interval is sensed by circuit 10 which is operative to provide an output signal proportional to average discharge current to the X input of the ratiometer 12. The change in capacitor voltage $\Delta V_c$ from its charged to discharged state is measured by circuit 14 which provides an output signal proportional to the measured voltage change to the Y input of the ratiometer 12. After the described charge/discharge cycle, the output of the ratiometer 12 is proportional to the capacitance of capacitor $C_T$.

In effect, the described capacitance measurement technique operates by measuring and taking the ratio of the total charge flow from, and the resulting voltage change across, the capacitor $C_T$. The result is by definition the value of capacitance of capacitor $C_T$.

The current measurement circuit 10 provides an output representative of average discharge current, i over some measured interval, $t_0$ to $t_1$, which includes the discharge interval:

$$\bar{i} = \frac{1}{t_1 - t_0} \int_{t_0}^{t_1} i(t)dt \qquad (1)$$

where i(t) is the capacitor current.

Since the time integral of current is charge, this average current can be interpreted as a measure of the charge, $\Delta Qc$, removed from the capacitor $C_T$ during the discharge interval:

$$\Delta Qc = \int_{t_0}^{t_1} i(t)dt \; (t_1 > t_0) \qquad (2)$$

substituting into (1):

$$\bar{i} = \frac{1}{t_1 - t_0} \Delta Qc \qquad (3)$$

The voltage measurement circuit 14 is operative to measure the voltage change $\Delta Vc$ across the capacitor from its charged to its discharged states without affecting the current to or from the capacitor during such measurement.

The ratiometer circuit provides an output signal which is representative of the ratio of the X input to the Y input. Specifically, since the X input is the output of the current measurement circuit 10, and since the Y input is the output of the voltage measurement circuit 14, the ratiometer output, $V_O$, can be expressed as:

$$V_0 = K \frac{\bar{i}}{\Delta V_c} \qquad (4)$$

where K is a proportionality constant. Substituting from (3):

$$V_0 = K \frac{1}{t_1 - t_0} \cdot \frac{\Delta Qc}{\Delta Vc} \qquad (5)$$

Since $\Delta Vc$ is the capacitor voltage change which results from the transfer of charge $\Delta Qc$, the term $\Delta Qc/\Delta Vc$ is by definition the capacitance C. Therefore:

$$V_0 = K \frac{1}{t_1 - t_0} C \qquad (6)$$

Thus, the output signal from the ratiometer circuit is directly proportional to the capacitance C. The transfer function of circuits 10, 12 and 14 can be scaled to provide an output of any convenient scale factor, or by reversing the inputs to the ratiometer, inversely proportional to capacitance.

Note that if the average current measurement circuit 10 is modified to function as a finite time current integrator, the $1/t_1 - t_0$ term in equation (1) is eliminated and equation (6) becomes:

$$Vo = kc \qquad (7)$$

Also note that if the measurement cycle is repeated periodically with period T, or frequency $f = 1/T$, then the average discharge current over each measurement interval is identical, constant and given by:

$$\bar{i} = \frac{1}{T} \int_T i(t)dt \qquad (8)$$

The capacitor voltage change is also constant for each cycle. For this case, equation (6) becomes:

$$Vo = kfc \qquad (9)$$

For the periodically repeating case, therefore, it is necessary only to provide a signal representative of the average discharge current to the X input of the ratiometer 12, and a signal representative of the capacitor voltage change ($\Delta Vc$) to the Y input. The voltage change will be essentially the same from cycle to cycle under equilibrium conditions.

Different circuit configurations can be employed to provide the measurement of average current. For example, with reference to FIG. 1, the current measurement circuit 10 can include a low-pass filter or other averaging network to provide an output signal which represents average current. Alternatively, the current measurement circuit 10 can provide an instantaneous measurement with no averaging, and with averaging provided by the ratiometer 12, which can be, for example, a dual-slope analog-to-digital converter. The output of the averaging ratiometer will be the ratio of average current to voltage difference. In a further embodiment, the current measurement circuit 10 and the ratiometer 12 do not provide averaging, but averaging is provided by a separate averaging circuit operative in response to the output signal from ratiometer 12 to provide an output signal representing the intended ratio of average current to voltage difference.

An advantage of the described capacitance measurement technique is that it permits a good degree of system design flexibility without affecting measurement accuracy. The voltage source V can provide any convenient voltage to which the capacitor $C_T$ is to be charged, and the capacitor need not be charged to a full charge level nor to any specific voltage level. Moreover, the capacitor need not be fully discharged, nor discharged to any particular voltage level. According to the present capacitance measuring technique, the voltage change between a charged voltage level and a discharged voltage level is employed irrespective of and without necessity for measurement of absolute voltage levels.

The switch S1 serves as a means for providing an initial voltage across the capacitor $C_T$. Other means can alternatively be employed to provide the initial voltage across the capacitor, provided that during the time interval that the capacitor current is measured, as the capacitor discharges from an initial to final level, no other current flow to the capacitor is permitted.

In the embodiment of FIG. 1, one terminal of the capacitor is connected to a common line and a single-ended voltage measurement is provided; however, the capacitor need not be grounded or connected to a common terminal as long as the voltage and current measurement circuits, 14 and 10, operate to measure the current flow from the capacitor and the voltage change ΔVc, which is also measured.

The switch S2 provides a means for controlling the interval during which the capacitor current is measured. The measured current flow is the total current to or from the capacitor during the interval over which the change in capacitor voltage is measured. Measurement of capacitor current is not permitted during the period that the capacitor is also being charged, during any period when the current measured would not be representative of total current flow from the capacitor, or during any period when the corresponding capacitor voltage change is not also measured.

Figure 2:
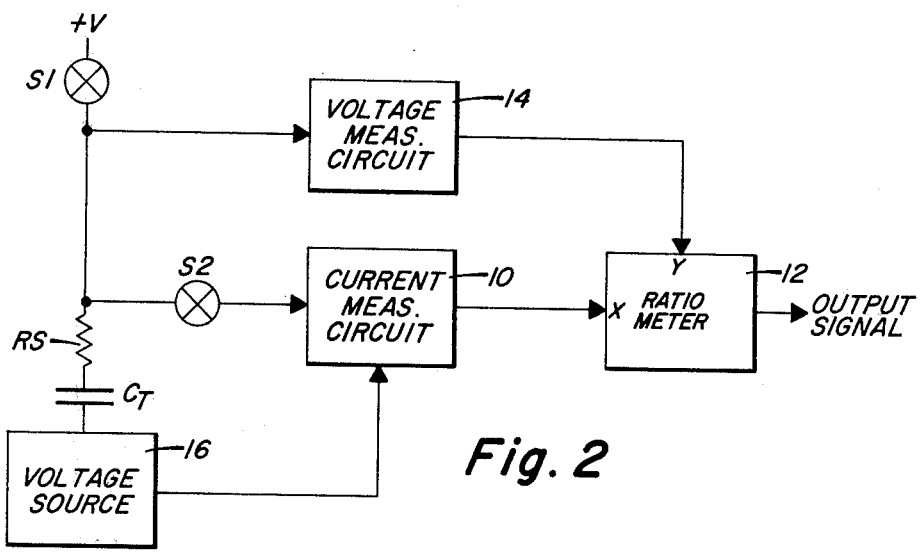
FIG. 2 is a diagrammatic representation of the novel capacitance measurement apparatus illustrating further features thereof.

The capacitance measurement technique is insensitive to any resistance or DC voltage in series with capacitor $C_T$. Thus, as shown in FIG. 2, a series resistor Rs can be included in the measurement system, as can a DC voltage source 16, which serves as a bias on the source voltage V.

As described above, the capacitor $C_T$ is initially charged to a first level and then discharged to provide a measure of voltage change and current flow from which capacitance is derived. The novel measurement technique is also operative for the opposite charging sequence. That is, the capacitor can be initially discharged and then charged to a level to provide a measure of voltage change and current flow. Thus, the measurement technique is equally effective for either charging sequence. For convenience, the embodiments described herein are for a sequence in which the capacitor under test is first charged and then discharged.

Figure 3:
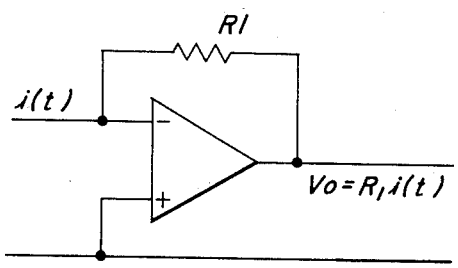
FIG. 3 is a schematic diagram of a typical operational amplifier circuit employed in the invention to provide an output voltage representative of capacitor current.
Figure 4:
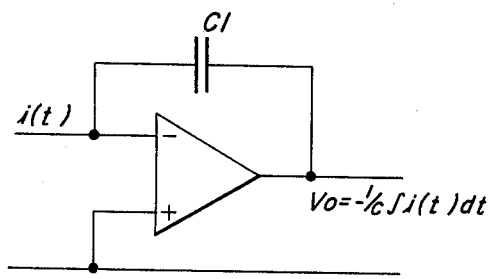
FIG. 4 is a schematic diagram of a typical operational integrator useful in the invention to provide an output voltage representative of average capacitor current.

The current measurement circuit is operative to provide a signal proportional to the average discharge current from capacitor $C_T$ during the measurement time interval. For the multiple cycle case, the circuit can simply be a parallel RC circuit through which the capacitor current flows to provide a corresponding DC voltage for application to the X input of ratiometer circuit 12. Alternatively a well-known operational amplifier circuit, such as shown in FIG. 3, can be employed to provide an output voltage $V_O$ representative of capacitor current. For the single cycle case in which the integral of current over the discharge interval is required, the current measurement circuit 10 can be implemented by an integrator, such as a capacitor, or an operational integrator as in FIG. 4.

The voltage measurement circuit 14 provides a signal which is proportional to the change in capacitor voltage ΔVc between the initial and final voltage levels, and this circuit can also be variously implemented. Exemplary implementations are shown in FIGS. 5 and 6. In FIG. 5, the capacitor voltage is applied to the input of an operational amplifier 17 which is coupled by electrically controlled switches SA and SB to capacitors $C_A$ and $C_B$. At a sample time $t_O$, switch SA is momentarily closed to store an initial voltage on capacitor $C_A$. At a sample time $t_1$, switch SB is momentarily closed to store a final voltage on capacitor $C_B$. The difference of the voltages stored on capacitors $C_A$ and $C_B$ is then representative of the voltage change on the test capacitor.

In the voltage measurement circuit of FIG. 6, the capacitor voltage is applied to the positive input of an operational amplifier 19 which is connected as shown to capacitors $C_C$ and $C_D$, and electrically-operated switches SC and SD. At a sample time $t_O$, switch SD is momentarily closed to charge capacitor $C_D$ to the initial voltage level. At sample time $t_1$, switch SC is momentarily closed to charge capacitor $C_C$ to a voltage which is equal, after several such cycles, to the final voltage level less the initial voltage level. Thus, an output is provided representative of the voltage difference on the test capacitor.

An embodiment of the novel capacitance-measuring technique is shown in FIG. 7 wherein the analog-to-digital converter is employed to perform the ratiometric function in a high performance manner. The capacitor under test $C_T$ has one terminal 20 connected via a switch Q1 to a voltage source V and also connected to an input of a buffer amplifier 24. The capacitor terminal 20 is also connected via a switch Q3 to a stable resistor R2 and a low-pass filter 26 composed of a series resistor R3 and shunt capacitor C3 to one signal input (IN HI) of an average reading analog-to-digital converter 28. The other terminal 22 of the capacitor $C_T$ is connected to a ground or common line, which is also connected to the other input terminal (IN LO) of converter 28. The output of buffer amplifier 24 is connected to a gain-adjusting variable resistor R4 and shunt resistor R5. A switch Q2 is coupled to capacitor C5 and to the REF HI input of converter 28. A switch Q4 is coupled to capacitor C4 and to the REF LO input of converter 28. The switches Q1–Q4 are solid-state switches controlled by respective signals $\phi 1$–$\phi 4$ provided by control logic 30 which is driven by an oscillator 32. The timing of the control signal is illustrated in FIGS. 8A–8D.

In operation, switch Q1 is closed by signal $\phi 1$ to connected capacitor $C_T$ to the voltage source in order to charge the capacitor to a first level. After the charging interval, determined by the duration of the control signal $\phi 1$, switch Q1 is opened and switch Q2 is closed by application of signal $\phi 2$ for an interval during which the charged voltage on capacitor $C_T$, attenuated by resistors R4 and R5, is stored on capacitor C5. The switch Q2 is then opened, and switch Q3 is closed by application of signal $\phi 3$ to permit discharge of the capacitor through resistor R2 which provides the only DC return path for the discharge current. The voltage across R2 is low-pass filtered by network 26 to provide an average voltage to the signal input of converter 28 which is a measure of average discharge current. During the next operating interval, switch Q4 is closed by operation of signal $\phi 4$, and the attenuated discharge voltage on the capacitor $C_T$ is stored on capacitor C4. The difference between the stored voltages on capacitors C4 and C5, which are an attenuated measure of the change of voltage on capacitor $C_T$, is provided to the reference input to converter 28.

The output signal from converter 28 is the ratio of the signal input to the reference input and can be expressed as:

$$\text{output} = K \frac{\overline{V_{in}}}{V_{ref}} = K(R2) \frac{\overline{I_{in}}}{\Delta V_c} \tag{10}$$

and can be shown to be $$\text{output} = k'(R2)fc \tag{11}$$

The output of converter 28 is thus proportional to capacitance and can be scaled by, among other things, frequency of operation and value of resistor R2. A network of resistors can be provided and selectively switched into the circuit for range changing. Effective implementation of range changing can also be provided by variation of the frequency of operation.

The output of converter 28 is of digital format and can be applied to a display 34 for numerical indication of measured capacitance, and can also be applied to any other utilization device.

The increment of time over which the change in voltage between the two charge levels of the capacitor is measured can be arbitrarily small, and measurement can be made for each small time increment to provide an effectively continuous measurement. The change in capacitor voltage $\Delta V_c$ can also be made on the fly as the voltage is changing, rather than charging and discharging the capacitor between arbitrary voltage levels to provide the voltage difference measurement.

It will be appreciated that various modifications and alternative embodiments will occur to those versed in the art without departing from the spirit of the invention. Accordingly, the invention is not to be limited by what has been particularly shown and described, except as indicated in the appended claims.

What is claimed is:

1. Capacitance measuring apparatus comprising:
   means for connection of a capacitor to be measured;
   means for charging said capacitor to any first voltage level and for discharging said capacitor to any second voltage level;
   means for providing a first signal representative of the difference between said first and second voltage levels;
   means for providing a second signal representative of the average current from said capacitor during the discharge thereof;
   means for obtaining the ratio of said second signal to said first signal and providing an output signal which is representative of the capacitance of said capacitor.

2. The capacitance measuring apparatus of claim 1 wherein said charging means includes a source of DC voltage and switch means operative to couple said source to said capacitor for a predetermined time.

3. The capacitance measuring apparatus of claim 1 wherein said means for charging and discharging includes a source of DC voltage and switch means operative to disconnect said capacitor from said source and to cause discharging of said capacitor.

4. Capacitance measuring apparatus comprising:
   means for connection of a capacitor to be measured;
   means for providing a first signal representative of a voltage difference between the voltage to which the capacitor is charged and a voltage to which the capacitor is discharged;
   means for providing a second signal representative of the average current from the capacitor during the discharge time thereof;
   means for providing an output signal representative of the ratio of the second signal to the first signal and representative of the capacitance of said capacitor.

5. The capacitance measuring apparatus of claim 4 wherein said voltage difference providing means includes a source of DC voltage and switch means for coupling said source to said capacitor for a predetermined time interval.

6. The capacitance measuring apparatus of claim 4 wherein said voltage difference providing means includes a source of DC voltage and first switch means for coupling said source to said capacitor for a predetermined time interval and second switch means operative when said first switch means is opened to cause discharging of said capacitor.

7. Capacitance measuring apparatus comprising:
   means for charging a capacitor to a first voltage level;
   means for discharging said capacitor to a second voltage level;
   means for providing a first signal representative of the voltage difference between said first and second voltage levels;
   means for providing a second signal representative of the average current from said capacitor during the discharge thereof; and
   means for providing an output signal proportional to the ratio of said second signal to said first signal and representative of the capacitance of said capacitor.

8. The capacitance measuring apparatus of claim 7 wherein said first voltage level to which said capacitor is charged is any arbitrary voltage.

9. The capacitance measuring apparatus of claim 8 wherein said second voltage level to which said capacitor is discharged is any arbitrary voltage including zero.

10. The capacitance measuring apparatus of claim 7 wherein said discharging means is operative to discharge said capacitor to ground potential.

11. The capacitance measuring apparatus of claim 7 wherein said second voltage level to which said capacitor is discharged is any arbitrary voltage including zero.

12. Capacitance measuring apparatus comprising:
    means for connection of a capacitor to be measured;
    means for providing a first signal representative of the voltage difference between two charge levels of said capacitor;
    means for providing a second signal representative of the average current from said capacitor during the time interval that the capacitor undergoes a change in its charge states;
    means for providing an output signal proportional to the ratio of said second signal to said first signal and representative of the capacitance of said capacitor.

13. The capacitance measuring apparatus of claim 12 wherein said means for providing an output signal includes an analog-to-digital converter having said first signal applied to a reference input thereof, and said second signal applied to a signal input thereof.

14. Capacitance measuring apparatus comprising:
    means for charging a capacitor to a first voltage level;
    means for discharging said capacitor to a second voltage level;
    means for providing a first signal representative of the voltage difference between said first and second voltage levels;
    means for providing a second signal representative of the average current from said capacitor during the discharge thereof;
    analog-to-digital converter means operative in response to said first signal applied to a reference input thereof and to said second signal applied to the signal input thereof to provide a digital output signal proportional to the ratio of said second signal to said first signal and representative of the capacitance of said capacitor.

15. The capacitance measuring apparatus of claim 14 wherein said charging means is operative in repetitive cycles having a first time interval for charging of said capacitor and a second time interval for discharging of said capacitor.

16. The capacitance measuring apparatus of claim 14 wherein said converter means includes a differential signal input and a differential reference input;
and wherein said first signal providing means includes a circuit operative to provide said voltage difference to the differential reference input of said converter means; and
wherein said second signal providing means includes a circuit operative to provide as said second signal a voltage to the differential signal input of said converter means.

17. The capacitance measuring apparatus of claim 14 wherein said charging means includes a source of DC voltage and a first solid-state switch operative to couple said source to said capacitor for a predetermined time.

18. The capacitance measuring apparatus of claim 17 wherein said discharging means includes a second solid-state switch and a current measurement circuit, said second switch being operative for a predetermined time interval after the charging interval to provide said second signal.

19. The capacitance measuring apparatus of claim 18 wherein said current measurement circuit includes averaging means for providing said second signal.

20. Capacitance measuring apparatus comprising:
means for connection of a capacitor to be measured;
means for providing a first signal representative of the voltage difference between two charge states of said capacitor;
means for providing a second signal representative of the current from said capacitor during the time interval that the capacitor undergoes a change in its charge states;
means for providing an output signal proportional to the ratio of average current from said capacitor during said time interval to said voltage difference and representative of the capacitance of said capacitor.

21. The capacitance measuring apparatus of claim 20 wherein said means for providing a second signal includes integrator means.

22. The capacitance measuring apparatus of claim 20 wherein said means for providing an output signal includes a ratiometer for providing the ratio of said second signal to said first signal, and an averaging circuit for providing said output signal.

23. Capacitance measuring apparatus comprising:
means for alternately charging and discharging a capacitor for at least one cycle;
means for providing a first signal representative of the change in voltage between two charge levels for each cycle;
means for providing a second signal representative of the current from the capacitor during each cycle; and
means for providing an output signal proportional to the ratio of average current from the capacitor during the time interval of said at least one cycle to said voltage change.

* * * * *

UNITED STATES PATENT AND TRADEMARK OFFICE
CERTIFICATE OF CORRECTION

PATENT NO. : 4,243,933
DATED : January 6, 1981
INVENTOR(S) : Charles D. Rollman

It is certified that error appears in the above-identified patent and that said Letters Patent are hereby corrected as shown below:

Column 3, line 4, change "current, i over" to
--current, I over--

Signed and Sealed this

Second Day of June 1981

[SEAL]

Attest:

RENE D. TEGTMEYER

Attesting Officer        Acting Commissioner of Patents and Trademarks